United States Patent
Rottstegge et al.

(10) Patent No.: US 7,052,820 B2
(45) Date of Patent: May 30, 2006

(54) SILICON-CONTAINING RESIST FOR PHOTOLITHOGRAPHY

(75) Inventors: Jörg Rottstegge, Erlangen (DE);
Eberhard Kühn, Hemhofen (DE);
Waltraud Herbst, Uttenreuth (DE);
Christian Eschbaumer, Schwaig (DE);
Christoph Hohle, Bubenreuth (DE);
Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 291 days.

(21) Appl. No.: 10/208,351

(22) Filed: Jul. 30, 2002

(65) Prior Publication Data

US 2003/0108812 A1    Jun. 12, 2003

(30) Foreign Application Priority Data

Jul. 30, 2001    (DE) ................ 101 37 109

(51) Int. Cl.
*G03C 1/73*    (2006.01)
*G03F 7/039*    (2006.01)
(52) U.S. Cl. ............... 430/270.1; 430/326; 430/905; 430/907
(58) Field of Classification Search ............ 430/270.1, 430/326, 905, 910, 907
See application file for complete search history.

(56) References Cited

U.S. PATENT DOCUMENTS

| 5,234,793 | A   | 8/1993  | Sebald et al. ............... 430/323  |
| 5,234,794 | A   | 8/1993  | Sebald et al. ............... 430/325  |
| 6,063,543 | A   | 5/2000  | Hien et al. ............... 430/270.1  |
| 6,210,856 | B1  | 4/2001  | Lin et al. ................. 430/270.1 |
| 6,296,985 | B1* | 10/2001 | Mizutani et al. ......... 430/270.1    |
| 6,623,909 | B1* | 9/2003  | Hatakeyama et al. .... 430/270.1       |

FOREIGN PATENT DOCUMENTS

| EP | 0 395 917 A2 | 11/1990 |
| EP | 0 955 562 A1 | 11/1999 |
| EP | 1 004 936 A1 | 5/2000  |

* cited by examiner

*Primary Examiner*—Sin Lee
(74) *Attorney, Agent, or Firm*—Laurence A. Greenberg; Werner H. Stemer; Ralph E. Locher

(57) ABSTRACT

A photoresist includes a polymer having a main chain composed of alternating silicon and oxygen atoms and a polymer chain segment which linked as a side chain to the main chain and whose chain is composed of carbon atoms. The chain composed of carbon atoms includes acid-labile groups, so that the photoresist according to the invention can be constructed as a chemically amplified photoresist.

10 Claims, 1 Drawing Sheet

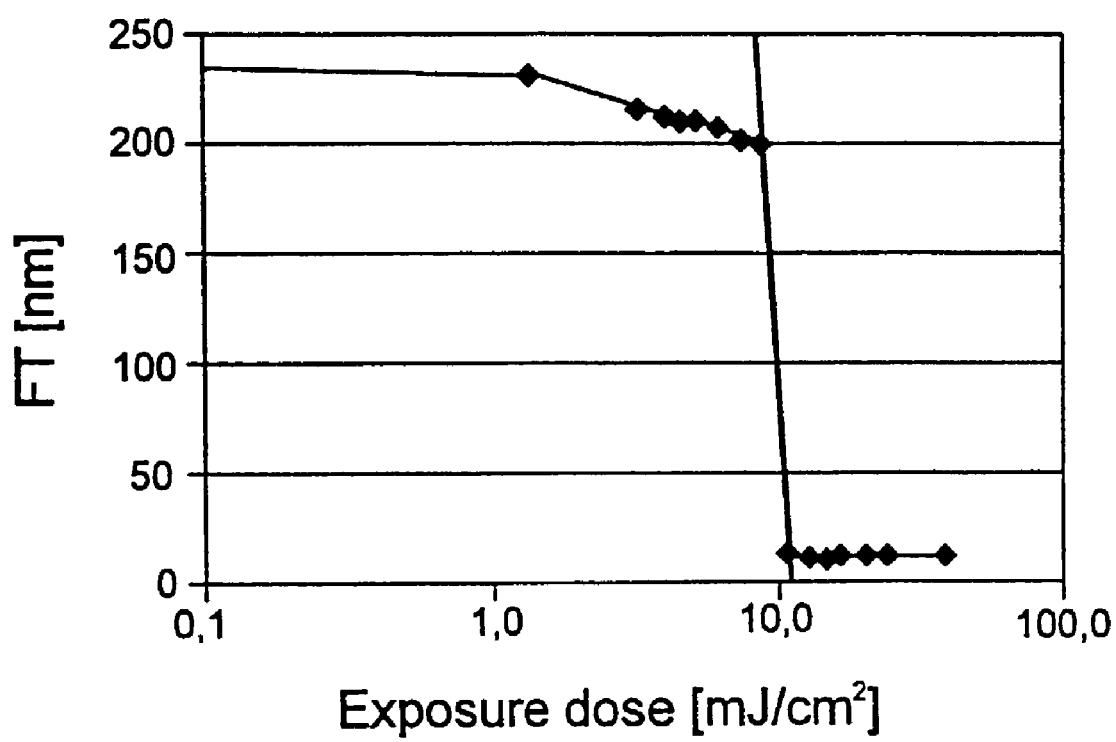

SILICON-CONTAINING RESIST FOR PHOTOLITHOGRAPHY

BACKGROUND OF THE INVENTION

1. Field of the Invention

The invention relates to a photoresist having a high proportion of silicon atoms.

Photoresists are used in various ways in numerous lithographic techniques in microelectronics. For example, resists are used as a mask in plasma etching processes in order to structure materials present under the resist, e.g. a silicon wafer. For this purpose, a thin film of photoresist is first applied to the substrate. By exposure to light, which is effected, for example, with the aid of a photo mask, by interference methods or by direct irradiation, for example with an electron beam or a beam of focused ions, chemical differentiation between the exposed and the unexposed parts of the photoresist is produced. After the exposure to light and after any heating step carried out, the parts differ, for example, in their solubility in polar solvents. Chemically amplified photoresists have been developed for achieving exposure times suitable for industrial applications. These contain a photoactive component that liberates a catalyst on exposure to light. For example, a photo acid generator that liberates a strong acid on exposure to light can be added as a photoactive component to the photoresist. A positive photoresist contains a polymer that has, for example, acid-labile groups. By heating (PEB "postexposure bake"), a large number of acid-labile groups can be eliminated after the exposure to light under the catalytic effect of the strong acid liberated. This liberates polar groups, for example carboxyl groups, so that the solubility of the polymer in an aqueous alkaline developer is drastically increased. If the exposed photoresist is developed after the postexposure bake, the exposed parts of the photoresist are detached from the substrate by the basic aqueous organic developer, so that the substrate is bared in these parts. The bared substrate surface can then be processed, for example by dry etching. For the etching, however, the resist structure remaining on the substrate must have sufficient etching resistance. This can be achieved, for example, by a sufficient film thickness of the resist structure.

In order to form even very small structures without imaging errors in the photoresist, increasingly short wavelengths are being used for the exposure. However, the currently available photoresists have a very high absorption at short wavelengths, so that only very thin photoresist films can be used to ensure that, even in the very deep parts of the photoresist film, a sufficient exposure dose is available for liberating the catalyst. In order to achieve sufficient etching resistance, the photoresist structure can be chemically amplified after the development. For this purpose, anchor groups, for example acid anhydride groups, which are capable of reacting with a reactive group of an amplification agent, are provided in the polymer of the photoresist. A suitable reactive group is, for example, the amino group, which can react with the acid anhydride group with formation of, for example, an amide bond. If the dry etching of the substrate is carried out in an oxygen plasma, silicon-containing agents are generally used as amplification agents. The amplification by silicon-containing amplification agents is generally referred to as silylation. During the etching in oxygen plasma, the silicon-containing group is oxidized and a protective film of silicon dioxide forms on the surface of the resist structure, which protects the substrate underneath from attack by the plasma. Such amplification of resist structures is described, for example, in commonly-owned, European Patent EP 0 395 917 B1, which corresponds to U.S. Pat. Nos. 5,234,794 and 5,234,793.

Photoresists in which the polymer already includes silicon-containing groups are also known. These can be prepared by using, for example, allyltrimethylsilane as a copolymer in the preparation of the polymer. Such a photoresist is described, for example, in commonly-owned European Patent Application No. EP 0 957 399 A2, which corresponds to U.S. Pat. No. 6,063,543.

Silicon-containing photoresists have high etching resistance in the oxygen plasma and, as a rule, exhibit high transparency at low exposure wavelengths, such as, for example, 157 nm or 13 nm. During the exposure of the photoresist to light, many bonds in the resist polymer are cleaved by the high energy of the radiation used, in particular at 157 and 13 nm, but to a far lesser extent even at 193 nm. If the silicon in the polymer of the photoresist is contained in a side group, a volatile low molecular weight silicon-containing compound may form after the elimination of the side group. During the exposure of the photoresist to light, expulsion of organosilicon compounds in gaseous form therefore takes place. Because the flushing of the optical systems with nitrogen is as a rule incomplete in the conventional exposure apparatuses, the optical exposure systems gradually become contaminated during the exposure of the resist to light. In contrast to expelled aliphatic and fluorine-containing gaseous products, however, the expelled silicon-containing products decompose slowly to nonvolatile silicon dioxide, which is deposited on the optical systems and irreversibly damages them.

SUMMARY OF THE INVENTION

It is accordingly an object of the invention to provide a silicon-containing resist for photolithography that overcomes the hereinafore-mentioned disadvantages of the heretofore-known devices of this general type and that permits resist structures having high etching resistance can be produced. The photoresist also has high transparency at low wavelengths and produces little or no expelled silicon-containing gaseous products during exposure to light.

With the foregoing and other objects in view, there is provided, in accordance with the invention, a photoresist. The photoresist includes a polymer having at least one first polymer chain segment and at least one second polymer chain segment. One of the polymer chain segments is formed from alternately disposed silicon and oxygen atoms and the other polymer chain segment is formed from carbon atoms. The polymer chain segment formed from carbon atoms includes acid-labile groups that are bonded to a group that has high polarity so that, after elimination of the acid-labile groups, the polymer is soluble in aqueous alkaline developers; a photo acid generator; and a solvent.

The photoresist according to the invention includes a polymer that includes two different polymer chain segments. One polymer chain segment preferably forms a side chain of the other polymer chain segment, so that a comb-like structure is formed. One of the polymer chain segments contains alternately disposed silicon and oxygen atoms in the chain. In contrast to many of the polymers used to date in photoresists, the polymer of the photoresist according to the invention therefore contains the silicon atoms not bonded in side groups which form low molecular weight compounds after elimination but as part of the polymer main chain. If a bond is broken in the polymer chain during the exposure as a result of the high energy of the exposure radiation, low-molecular-weight fragments that lead to volatile silicon-containing compounds are therefore no longer formed, but silicon-containing molecular fragments that furthermore have a very high molecular weight are formed. Consequently, expulsion of gaseous low molecular weight silicon-containing compounds is virtually completely suppressed. Consequently, the optical systems of the exposure apparatuses show no silicon dioxide deposits at low exposure doses or at least considerably smaller amounts of deposits at very high exposure doses. Owing to the high silicon content, the polymer acquires high transparency to light of low wavelengths, so that thicker photoresist films, which can be exposed to a short exposure wavelength, for example 157 nm or 13 nm, also can be advantageously produced. Furthermore, the high silicon content ensures excellent resistance of the resist structures produced to an oxygen plasma. Therefore, amplification of the photoresist for increasing the etching stability is generally not required even in the case of small film thicknesses.

The polymer of the photoresist according to the invention differs from other resist polymers that contain silicon in the main chain through the special composition of the polymers. The known polymers contain low molecular weight side groups, some of which are cleavable. However, high-molecular-weight polymer chain segments formed from carbon atoms are contained in the polymer of the photoresist according to the invention. These polymer chain segments are obtained by copolymerization or graft polymerization. The molecular weight of the polymer chain segment formed from carbon atoms is in general in the range between 100 and 1,000 g/mol. The molecular weight of the total polymer is in general in the range from 5,000 to 20,000, preferably from 8,000 to 12,000, g/mol.

A polymer chain segment formed from carbon atoms is understood as meaning a polymer chain whose main chain or backbone is formed from carbon atoms. Such a chain can be obtained, for example, by free radical polymerization of a carbon-carbon double bond. Depending on the monomer used, the polymer chain segment formed from carbon atoms may also contain heteroatoms, such as oxygen or nitrogen, as side groups.

The main chain or the backbone of the other polymer chain segment is formed analogously from alternately disposed silicon and oxygen atoms. Groups that contain carbon or other heteroatoms can be connected as side groups on this chain segment.

Owing to the polymer chain segment formed from carbon atoms, the properties of the polymer can be varied within wide ranges by linkage with suitable groups. The carbon chain of the polymer includes acid-labile groups that are attached as side groups. After elimination of the acid-labile group, a group that increases the solubility of the polymer in aqueous alkaline developers is liberated. The photoresist according to the invention is therefore formed as a chemically amplified photoresist.

Acid-labile groups that may be used are customary groups such as those known for polymers of positive photoresists. For example, tert-alkyl ester, tert-butoxycarbonyloxy, tetrahydrofuranyl, tetrahydro-pyranyl, cyclohexylethyl, or acetal groups are suitable. Tert-butyl ester groups are particularly preferred.

All compounds that liberate an acid on irradiation can be used as photo acid generators for the photoresist. Onium compounds as described in commonly-owned, European Patent Application No. EP 0 955 562 A1 are advantageously used.

All conventional photoresist solvents or mixtures thereof, which are capable of taking up the resist components in a clear, homogeneous solution having a long shelf life and ensure good film quality during the coating of the substrate can be used as solvents for the photoresist. Examples of suitable solvents are methoxypropyl acetate, oligoethylene glycol ether, cyclopentanone, cyclohexanone, -butyrolactone, ethyl lactate or a mixture of at least two of these compounds.

Other features that are considered as characteristic for the invention are set forth in the appended claims.

Although the invention is illustrated and described herein as embodied in a silicon-containing resist for photolithography, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE is a graph plotting the film thickness (FT) of the developed photoresist versus the radiation dose used during the exposure.

DESCRIPTION OF THE PREFERRED EMBODIMENTS

EXAMPLE

The structurable polymer used was a polydimethylsiloxane grafted with polyacrylates and polymethacrylates. This was prepared from a polymer consisting of about 80% of dimethylsiloxane and about 20% of acrylic and methacrylic acid (grafted). For this purpose, the carboxyl side groups were protected with tetrahydropyran. To achieve this, the polymer was dissolved in dichloromethane and esterified with tetrahydropyran under acid catalysis. After neutralization and extraction of the acid with an aqueous sodium bicarbonate solution, the polymer was precipitated with petroleum ether. A polymer having a molecular weight of about 26,000 was thus obtained. A photoresist including a 7% strength by weight solution of the polymer in methoxypropyl acetate, a photo acid generator (0.35% by weight of triphenylsulfonium nonaflate) and a base (trioctylamine) for adjusting the sensitivity was prepared from these polymers. The structurability of the resist polymer prepared above was demonstrated at an exposure wavelength of 248 nm with different radiation doses. The chemical amplification method was used. The exposure to light produced a strong acid that cleaved the protective groups in a postexposure bake and thus rendered the polymer soluble in an aqueous developer. The exposed and baked resist was developed with an aqueous solution of 4% by weight of tetramethylammonium hydroxide, and the film thickness of the resist material remaining after the exposure to light was then determined. The measured film thicknesses are shown as a function of the radiation dose in FIG. 1. It can be seen that the photoresist can be completely detached from the substrate during the development after a threshold value of 10 mJ/cm$^2$ of the photoresist is exceeded.

It is therefore an object of the invention to provide a photoresist. The photoresist includes resist structures that have high etching resistance can be produced. The photoresist also has high transparency at low wavelengths and only little or no expelled silicon-containing gaseous products being produced during the exposure to light.

The object is achieved by a photoresist including a polymer having at least one first polymer chain segment and at least one second polymer chain segment, a photo acid generator, and a solvent. One of the polymer chain segments is formed from alternating silicon and oxygen atoms and the other polymer chain segment is formed from carbon atoms. The polymer chain segment formed from carbon atoms includes acid-labile groups that are bonded to a group having high polarity so that, after elimination of the acid-labile groups, the polymer is soluble in aqueous alkaline developers.

The photoresist according to the invention includes a polymer having two different polymer chain segments. One polymer chain segment preferably forms a side chain of the other polymer chain segment, so that a comb-like structure is formed. One of the polymer chain segments contains alternately disposed silicon and oxygen atoms in the chain. In contrast to many of the polymers used to date in photoresists, the polymer of the photoresist according to the invention therefore contains the silicon atoms not bonded in side groups that form low molecular weight compounds after elimination, but rather as part of the polymer main chain. If a bond is broken in the polymer chain during the exposure as a result of the high energy of the exposure radiation, low-molecular weight fragments that lead to volatile silicon-containing compounds are therefore no longer formed, but silicon-containing molecular fragments that furthermore have a very high molecular weight are formed. Consequently, expulsion of gaseous low-molecular-weight, silicon-containing compounds is virtually completely suppressed. Consequently, the optical systems of the exposure apparatuses show no silicon dioxide deposits at low exposure doses or at least considerably smaller amounts of deposits at very high exposure doses. Due to the high silicon content, the polymer acquires high transparency to light of low wavelengths, so that thicker photoresist films, which can be exposed to a short exposure wavelength, for example 157 nm or 13 nm, can advantageously also be produced. Furthermore, the high silicon content ensures excellent resistance of the resist structures produced to an oxygen plasma. Amplification of the photoresist for increasing the etching stability is therefore generally not required even in the case of small film thicknesses.

The polymer of the photoresist according to the invention differs from other resist polymers that contain silicon in the main chain through the special composition of the polymers. The known polymers contain low-molecular-weight side groups, some of which are cleavable. However, high-molecular-weight polymer chain segments formed from carbon atoms are contained in the polymer of the photoresist according to the invention. These polymer chain segments are obtained by copolymerization or graft polymerization. The molecular weight of the polymer chain segment formed from carbon atoms is in general in the range between 100 and 1,000 g/mol. The molecular weight of the total polymer is in general in the range from 5,000 to 20,000, preferably from 8,000 to 12,000, g/mol.

A polymer chain segment formed from carbon atoms is understood as meaning a polymer chain whose main chain or backbone is formed from carbon atoms. Such a chain can be obtained, for example, by free radical polymerization of a carbon-carbon double bond. Depending on the monomer used, the polymer chain segment formed from carbon atoms may also contain heteroatoms, such as oxygen or nitrogen, as side groups.

The main chain or the backbone of the other polymer chain segment is formed analogously from alternately disposed silicon and oxygen atoms. Groups that contain carbon or other heteroatoms can be disposed as side groups on this chain segment.

Due to the polymer chain segment formed from carbon atoms, the properties of the polymer can be varied within wide ranges by linkage with suitable groups. The carbon chain of the polymer includes acid-labile groups that are disposed as side groups. After elimination of the acid-labile group, a group that increases the solubility of the polymer in aqueous alkaline developers is liberated. The photoresist according to the invention is therefore formed as a chemically amplified photoresist.

Acid-labile groups that may be used are customary groups such as those known for polymers of positive photoresists. For example, tert-alkyl ester, tert-butoxycarbonyloxy, tetrahydrofuranyl, tetrahydro-pyranyl, cyclohexylethyl, or acetal groups are suitable. Tert-Butyl ester groups are particularly preferred.

All compounds which liberate an acid on irradiation can be used as photo acid generators for the photoresist. Onium compounds as described in European Patent Application No. EP 0 955 562 A1 are advantageously used.

All conventional photoresist solvents or mixtures thereof that are capable of taking up the resist components in a clear, homogeneous solution having a long shelf life and ensure good film quality during the coating of the substrate can be used as solvents for the photoresist. Examples of suitable solvents are methoxypropyl acetate, oligoethylene glycol ether, cyclopentanone, cyclohexanone, γ-butyrolactone, ethyl lactate, or a mixture of at least two of these compounds.

Those valencies of the polymer chain segment formed from alternately disposed oxygen and silicon atoms that are not saturated by the other polymer chain segment formed from carbon atoms are preferably saturated with alkyl, aryl, or cycloalkyl radicals. For example, alkyl groups having 1 to 10 carbon atoms, aryl groups having 6 to 20 carbon atoms, such as, in particular, a phenyl group, cycloalkyl groups having 5 to 20 carbon atoms, such as, for example, a cyclohexyl group, or arylalkyl groups having 7 to 20 carbon atoms, such as a benzyl group, are suitable. In a preferred embodiment, the polymer chain segment formed from alternately disposed silicon and oxygen atoms also includes acid-labile groups that are bonded to a group that has high polarity. Groups that have a proton that can be eliminated, i.e. for example carboxyl groups or (acidic) hydroxyl groups, such as phenolic hydroxyl groups, are suitable as a group having high polarity, as in the case of the polymer chain segment formed from carbon atoms. These groups can be linked to the silicon-containing main chain via a low molecular weight organic radical, for example an alkyl chain or a phenyl ring, and can be esterified or etherified with appropriate acid-labile groups. Suitable acid-labile groups are, for example, the abovementioned acid-labile groups.

The first polymer chain segment that forms the main chain of the polymer and from which the second polymer chain segments preferably branch off as side chains is preferably formed from alternately disposed silicon and oxygen atoms. The resist polymers can be prepared by a plurality of methods, for example by grafting reactive monomers onto silicon-containing main chain polymers. The monomers may already carry the acid-labile groups. It is possible to use only one individual compound as a monomer or a plurality of different monomers as copolymerized units. The polymer chain segment formed from carbon atoms can be synthesized, for example, by free radical polymerization in the presence of silicon-containing polymers having aliphatic side groups. The linkage of the polymer chain segments composed of carbon atoms is effected via a chain transfer reaction. However, in this process, a broad distribution of the molecular weights of the reaction products must be accepted. Specific bonding of the polymer side chain to the silicon-containing main chain is also difficult to control.

Substantially better defined products are obtained by catalytic reaction of hydrosiloxane compounds or hydrosilsesquioxane compounds with dienes in the presence of platinum/platinum complexes and subsequent free radical or anionic copolymerization of suitable unsaturated monomers. The polymers of the photoresist according to the invention can also be copolymerized with suitable unsaturated monomers by copolymerization of polymers which have alternating silicon and oxygen atoms in their main chain and in which an unsaturated group, such as a vinylphenylene group, is bonded as a side group to the main chain, the side chain formed from carbon atoms being produced.

In a further embodiment, the preparation of the polymers is carried out by direct catalytic reaction of hydrosiloxane or hydrosilsesquioxane compounds with reactive unsaturated oligomers or polymer chain segments.

Preferably, the chain of the first polymer chain segment is formed from a siloxane or a silsesquioxane.

A preferred class of compounds that have a first polymer chain segment composed of a siloxane includes compounds of the Formula I.

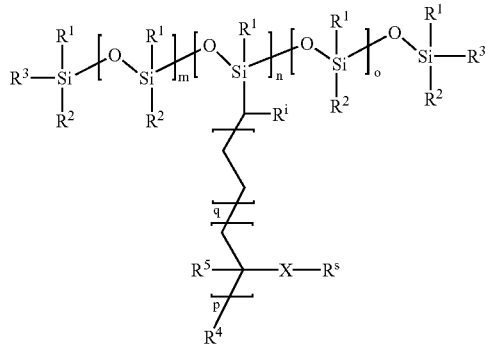

Formula I

Polymer chain segments whose main chain is formed from carbon atoms are bonded as side groups to the siloxane chain composed of alternating silicon and oxygen atoms. The chain formed from carbon atoms has acid-labile groups $R^s$. The acid-labile groups $R^s$ change the solubility properties between the exposed and unexposed parts of the photoresist after exposure to light and amplification.

For purposes of this patent application, the following symbols have the respective meanings:

$R^1$, $R^2$ and $R^3$, in each case independently of one another, are an alkyl radical having 1 to 10 carbon atoms, a cycloalkyl radical having 5 to 20 carbon atoms, an aryl radical having 6 to 20 carbon atoms, an aralkyl radical having 7 to 20 carbon atoms or a polar radical protected by an acid-labile group;

$R^i$ is a hydrogen atom, an initiator group or a polymer chain having an initiator group, the initiator group being formed from the initiator of the polymerization;

$R^4$ is hydrogen or a polymer chain, the chain being formed from carbon atoms;

$R^5$ is hydrogen, halogen, pseudohalogen, an alkyl group having 1 to 10 carbon atoms, or an at least partially halogenated alkyl group having 1 to 10 carbon atoms;

$R^s$ is an acid-labile group;

X is a group that, after elimination of the group $R^s$, has high polarity and then increases the solubility of the polymer in aqueous alkaline developers;

m and o are ordinal numbers (i.e. m, n∈{0, 1, 2, 3 . . . }), the sum of m and o being greater than 10;

n is an integer that is greater than or equal to 1;

q is 0 or an integer that is greater than or equal to 1;

p is an integer that is greater than or equal to 1;

it being possible for the repeating units characterized by the indices m, n, o, p, and q to be disposed in any desired sequence. n is preferably less than 20 and q is preferably 0 or 1.

m and o are preferably chosen to be between 25 and 500, in particular between 50 and 500. The repeating unit characterized by the index n contains the polymeric side chain. In order to maintain the molecular weight in the preferred range, n is preferably chosen to be between 1 and 20. For the polymeric side chain, p is preferably chosen to be between 1 and 500, particularly preferably between 5 and 50; q is preferably 0 or 1. The value of the indices is determined from the respective maximum of the molecular weight distribution of the polymer contained in the photoresist according to the invention.

The radicals $R^1$, $R^2$, and $R^3$ bonded to the siloxane chain are preferably a methyl group, a cyclohexyl group, or a phenyl group, it being possible for the radicals $R^1$, $R^2$ and $R^3$, whenever they occur on the siloxane chain, also to have different meanings. Polar groups that are protected by acid-labile groups can also be provided on the siloxane chain. An example of this is a tert-butoxycarbonylphenoxy group. Polymeric chain segments whose chain is formed by carbon atoms are bonded as a side chain to the siloxane main chain. This side chain may carry small nonpolar substituents $R^5$, such as methyl groups, trichloromethyl groups or nitrile groups. Furthermore, the polymeric side chain includes acid-labile groups $R^s$ that are bonded to the polar group X. The group X may be, for example, a carboxyl group. In this case, for example, acrylates, methacrylates, maleic mono or diesters, cyclohexenedicarboxylic mono- or diesters, norbornenecarboxylic esters or itaconic mono- or diesters protected by an acid-labile group can be used for synthesizing the polymer chain segment. The group X may also include an (acidic) hydroxyl group, e.g. a phenolic hydroxyl group. Corresponding styrene derivatives are then used as starting materials for the preparation of the side chain.

The side chain furthermore includes a radical $R^4$ that continues the chain formed from carbon atoms. Different monomers may be used here. Examples are methyl acrylates, methyl methacrylates, or styrenes. These monomers can be incorporated into the side chain either by block copolymerization or by copolymerization with the monomers containing an acid-labile group.

The linkage of the side chain to the siloxane main chain is effected by the reactions described above, for example by grafting or copolymerization of the siloxane substituted by a polymerizable radical with the monomers which form the carbon side chain.

Depending on the reaction conditions, the group $R^i$ may be a hydrogen atom or an initiator group for initiating a free radical polymerization or a polymer chain having an initiator group. Examples of free radical initiators and initiator groups derived from these are shown in Table 1.

TABLE 1

Examples of Free Radical Initiators and Initiator Groups $R^i$ Derived from Them

| Initiator for free radical polymerization | Group $R^i$ remaining on the polymer |
|---|---|
| $Na_2S_2O_8$ | *—$SO_4$Na |

[structural formulas of di-tert-butyl peroxide, benzoyl peroxide, cumene hydroperoxide, AIBN, and azobiscyclohexanecarbonitrile with corresponding initiator groups]

In addition to the initiators for a free radical polymerization that are shown, other diacyl peroxides or azo compounds can also be used.

Suitable cationic initiators are, for example, $BF_3$, $TiCl_4$, $SnCl_4$, $AlCl_3$, and other Lewis acids. $R^i$ is in this case generally a hydrogen atom.

Examples of anionic initiators are shown in table 2.

TABLE 2

Examples of Anionic Initiators and Initiator Groups $R^i$ Derived from Them

| Initiator class | Initiator | Group $R^i$ remaining on the polymer |
|---|---|---|
| Alcoholates | $K^+$ $^-O-C(CH_3)_3$ | *—$O-C(CH_3)_3$ |
| Metal amides | $Na^+$ $NH_2^-$ | —$NH_2$ |
| Metal alkyls | $Li^+$ $^-CH_2CH_2CH_3$ | —$CH_2CH_2CH_3$ |
| | $K^+$ [naphthalene]$^-$ | *—[naphthyl] |

An example in which the group X is in the form of a carboxyl group is represented by the compound of the Formula IA.

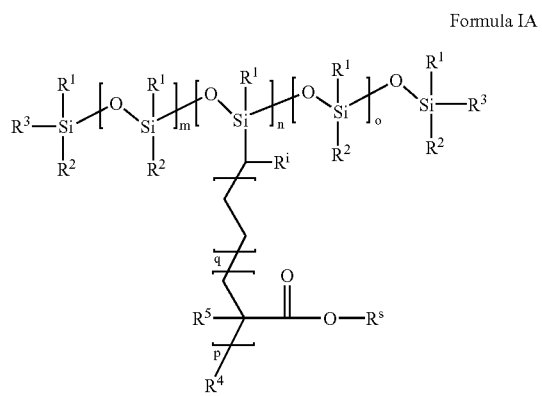

Formula IA in which the radicals $R^1$ to $R^5$, $R^i$ and $R^s$ and the indices m, n, o, p, and q have the abovementioned meaning.

The number of side chains on the siloxane can be varied within wide ranges. An example of a class of compounds having two polymeric side chains is represented as Formula IB.

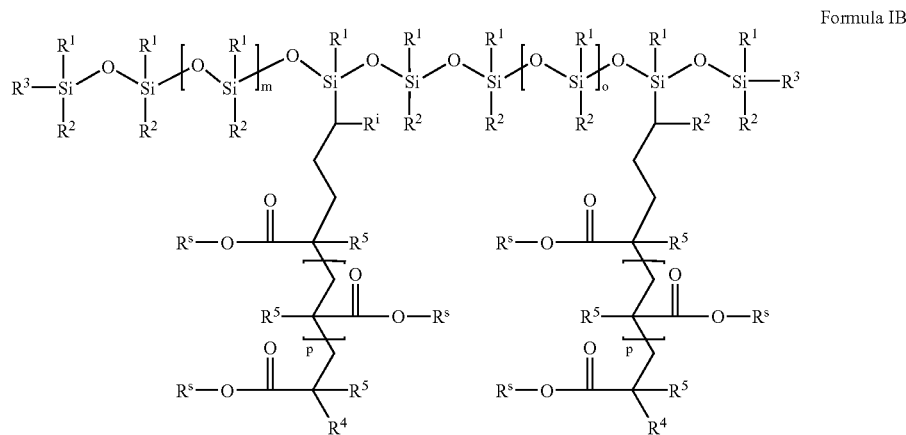

Formula IB in which the radicals and indices have the above-mentioned meaning and p denotes an integer between 0 and 100.

An example of a class of compounds that includes silsesquioxanes as the main chain from which side chains including a carbon chain branch off is shown in Formula II.

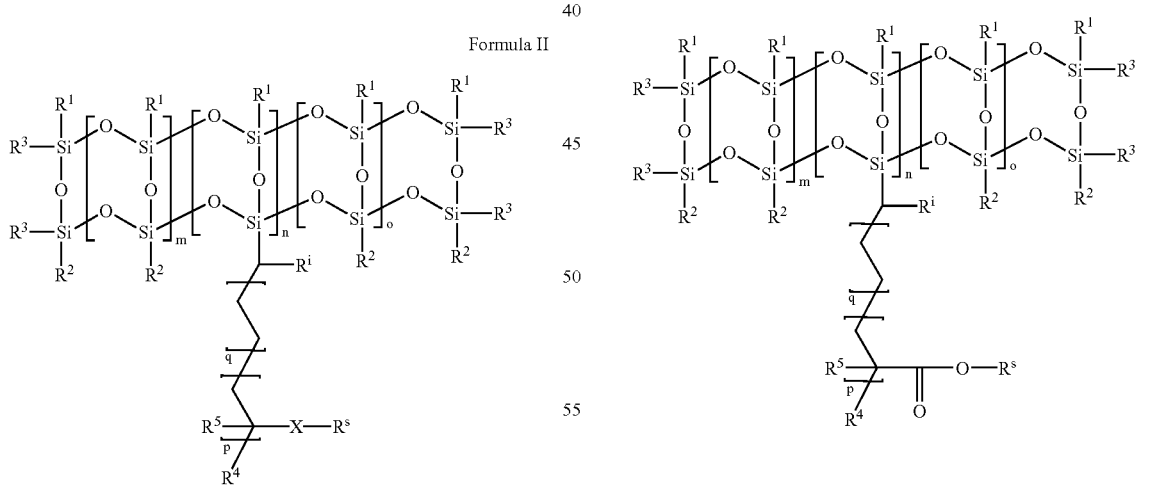

Formula II

Formula IIA in which the radicals $R^1$, $R^2$, $R^3$, $R^4$, $R^5$, $R^i$, $R^s$, and X and the indices m, n, o, p, and q have the meaning stated in the case of the formula I. The polymers derived from a silsesquioxane can be prepared by the same processes as described above. An example of a class of compounds in which the group X is in the form of a carboxyl group is shown as Formula IIA.

In the case of this class of compounds too, the number of side chains may vary within wide limits. Preferably, n is between 1 and 20; m and o are preferably chosen to be between 25 and 300. An example of a polymer having two side chains is shown below as Formula IIB.

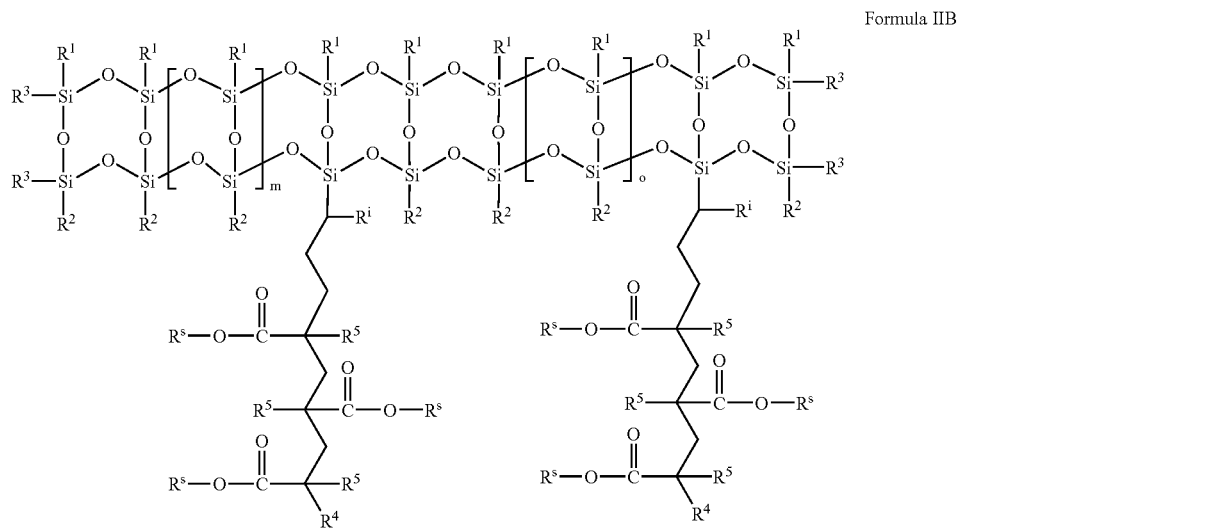

Formula IIB

In addition to the acid-labile groups, the chain segment formed from carbon atoms may also have further reactive anchor groups that are available for amplification of the photoresist. Such groups are, for example, carboxylic anhydride groups. They are obtained by copolymerization of monomers, such as maleic anhydride, itaconic anhydride, norbornenedicarboxylic anhydride, cyclohexanedicarboxylic anhydride or methacrylic anhydride, in the preparation of the polymeric side chain.

The developed resist structures can then be expanded, for example, by a process as described in commonly-owned, European Patent EP 0 395 917 B1, so that an increase in the resolution can be achieved.

The photoresist according to the invention can be processed by conventional methods. The resist according to the invention is first applied to the substrate to be structured and is dried in a subsequent heating step, in which the solvent can evaporate at temperatures of 60 to 180° C. In the solid resist film obtained, a latent image of the desired structure is now produced by controlled irradiation, which latent image contains, in the exposed parts, the acid produced from the photo acid generator. UV radiation can be used for the exposure, the latent image being produced, for example, with a photo mask or by interference methods. However, direct irradiation is also possible, for example, by irradiation with an electron beam or with a beam of focused ions. In a heating step following the exposure to light (postexposure bake, PEB), the temperature of which is often above the temperature of the first heating step and is generally chosen in the range from 80 to 200° C., the acid-labile groups on the polymer are eliminated by the catalytic effect of the acid produced during the exposure to light. In the exposed parts, the resist film thus becomes soluble in an alkaline developer. In the subsequent development step, the exposed parts are detached from the substrate. If the resist additionally already has a reactive group for chemical amplification, such as, for example, acid anhydride groups or acidic groups, such as carboxyl groups, a subsequent direct silylation and hence additional amplification of the dry etching resistance or expansion of the resist structure is additionally possible.

The components described above can be used in the resist according to the invention in the following ratios:
Polymer: 1 to 50% by weight, preferably 2 to 8% by weight;
Photo-acid generator: 0.001 to 10% by weight, preferably 0.01 to 0.5% by weight;
Solvent: 50 to 99% by weight, preferably 92 to 97% by weight;
Thermo acid generator: 0.01 to 5% by weight, preferably 0.05 to 1% by weight, if contained in the photoresist.

A thermo acid generator can be added to the photoresist if, for the subsequent expansion of the resist structures, the groups for linking an amplification agent first have to be liberated from the polymers under the action of acid. For this purpose, an additional heating step in which the substrate with the resist structure is heated to temperatures of 80 to 200° C., i.e. higher than all previous heating steps, is effected after the development of the resist structure. The acid-labile groups are now eliminated, even in the unexposed parts, by the strong acid liberated during the heating, with the result that the polar groups are liberated as anchor groups for the amplification agent. Alternatively, exposure to floodlights with a subsequent heating step at temperatures of 60 to 170° C. is possible. After elimination in the acid-labile groups, the structured resist is treated with the silylating solution that contains siloxanes having basic groups, such as, for example, aminosiloxanes. The structures are thus subsequently expanded. Finally, washing is carried out using a suitable wash solution.

In addition to the components described above, the photoresist according to the invention can also include further conventional components which influence the resist system advantageously with respect to resolution, film formation properties, shelf life, radiation sensitivity, pot life effects, etc.

We claim:
1. A photoresist, comprising:
a polymer having at least one first polymer chain segment and at least one second polymer chain segment, said at least one first polymer chain segments being formed from alternately disposed silicon and oxygen atoms and said at least one second polymer chain segment being formed from carbon atoms forming side chains to said first polymer chain segment, said polymer chain segment formed from carbon atoms including acid-labile groups and a group having high polarity bonded to at least one of said acid-labile groups, said groups having high polarity making said polymer soluble in aqueous alkaline developers after elimination of said acid-labile groups;

said polymer being a compound according to Formula I

Formula I

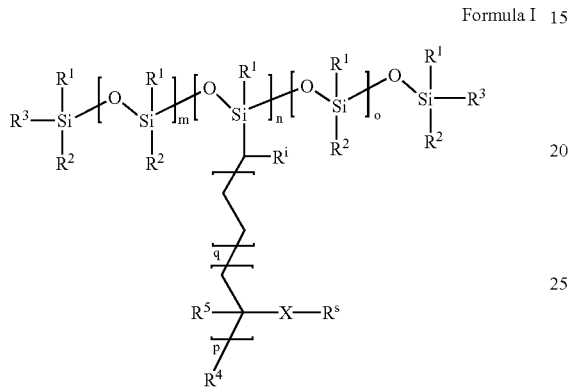

wherein;

$R^1$, $R^2$, and $R^3$ denote radicals selected in each case independently of one another from the group consisting of alkyl radicals having 1 to 10 carbon atoms, cycloalkyl radicals having 5 to 20 carbon atoms, aryl radicals having 6 to 20 carbon atoms, aralkyl radicals having 7 to 20 carbon atoms, and polar radicals protected by an acid-labile group;

$R^i$ denotes a hydrogen atom or an initiator selected from the group consisting of an initiator group, and a polymer chain having an initiator group;

$R^s$ denotes an acid-labile group;

$R^4$ denotes a polymer chain formed from carbon atoms;

$R^5$ denotes a substituent selected from the group consisting of a hydrogen, a halogen, a pseudohalogen, an alkyl group having 1 to 10 carbon atoms, and an at least-partially halogenated alkyl group having 1 to 10 carbon atoms;

X denotes a highly-polar group increasing the solubility of the polymer in aqueous alkaline developers after elimination of said group $R^5$;

m and o denote ordinal numbers having a sum greater than 10;

n denotes an integer of at least 1;

q denotes an ordinal number;

p denotes an integer at least equal to 1;

repeating units including indices m, n, o, p, and q are disposed in any desired sequence;

a photo acid generator; and a solvent.

2. The photoresist according to claim 1, wherein said polymer chain segment formed from carbon atoms includes anchor groups for amplification.

3. The photoresist according to claim 1, wherein a sum of m and o is between 25 and 500.

4. The photoresist according to claim 3, wherein said sum of m and o is between 50 and 500.

5. The photoresist according to claim 1, wherein n is between 1 and 20.

6. A photoresist, comprising:

a polymer having at least one first polymer chain segment and at least one second polymer chain segment, said at least one first polymer chain segments being formed from alternately disposed silicon and oxygen atoms and said at least one second polymer chain segment being formed from carbon atoms forming side chains to said first polymer chain segment, said polymer chain segment formed from carbon atoms including acid-labile groups and a group having high polarity bonded to at least one of said acid-labile groups, said groups having high polarity making said polymer soluble in aqueous alkaline developers after elimination of said acid-labile groups;

said polymer being a compound according to Formula II

Formula II

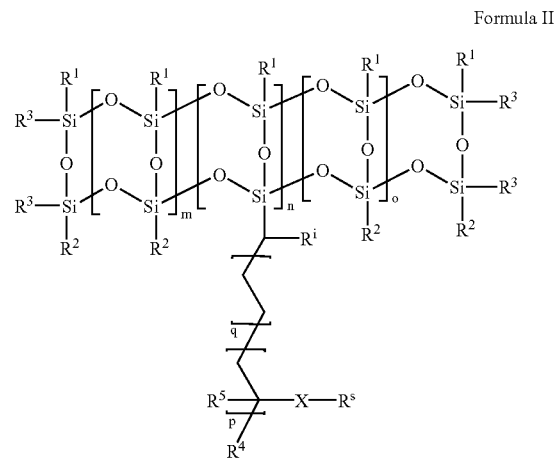

wherein:

$R^1$, $R^2$, and $R^3$ denote radicals selected in each case independently of one another from the group consisting of alkyl radicals having 1 to 10 carbon atoms, cycloalkyl radicals having 5 to 20 carbon atoms, aryl radicals having 6 to 20 carbon atoms, aralkyl radicals having 7 to 20 carbon atoms, and polar radicals protected by an acid-labile group;

$R^i$ denotes a hydrogen atom or an initiator selected from the group consisting of an initiator group, and a polymer chain having an initiator group;

$R^s$ denotes an acid-labile group;

$R^4$ denotes a polymer chain formed from carbon atoms;

$R^5$ denotes a substituent selected from the group consisting of a hydrogen, a halogen, a pseudohalogen, an alkyl group having 1 to 10 carbon atoms, and an at least-partially halogenated alkyl group having 1 to 10 carbon atoms;

X denotes a highly-polar group increasing the solubility of the polymer in aqueous alkaline developers after elimination of said group $R^5$;

m and o denote ordinal numbers having a sum greater than 10;

n denotes an integer of at least 1;

q denotes an ordinal number;

p denotes an integer at least equal to 1;

repeating units including indices m, n, o, p, and q are disposed in any desired sequence;

a photo acid generator; and a solvent.

7. The photoresist according to claim 6, wherein a sum of m and o is between 25 and 500.

8. The photoresist according to claim 7, wherein said sum of m and o is between 50 and 500.

9. The photoresist according to claim 6, wherein n is between 1 and 20.

10. The photoresist according to claim 6, wherein said polymer chain segment formed from carbon atoms includes anchor groups for amplification.

* * * * *